(12) United States Patent
Pinarbasi

(10) Patent No.: US 7,652,856 B2
(45) Date of Patent: Jan. 26, 2010

(54) CURRENT PERPENDICULAR TO PLANE (CPP) MAGNETORESISTIVE SENSOR HAVING STRONG PINNING AND SMALL GAP THICKNESS

(75) Inventor: Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 518 days.

(21) Appl. No.: 11/320,547

(22) Filed: Dec. 27, 2005

(65) Prior Publication Data

US 2007/0146939 A1    Jun. 28, 2007

(51) Int. Cl.
G11B 5/33 (2006.01)
(52) U.S. Cl. .................................. 360/324.11
(58) Field of Classification Search ............. 360/324.11
See application file for complete search history.

(56) References Cited

U.S. PATENT DOCUMENTS

| | | | | |
|---|---|---|---|---|
| 5,867,025 | A * | 2/1999 | Allenspach et al. | 324/252 |
| 6,381,107 | B1 * | 4/2002 | Redon et al. | 360/324.2 |
| 6,433,969 | B1 * | 8/2002 | Nagahara | 360/317 |
| 6,636,395 | B1 * | 10/2003 | Terunuma | 360/324.11 |
| 2003/0184919 | A1 | 10/2003 | Lin et al. | 360/314 |
| 2003/0203238 | A1 | 10/2003 | Saito | 428/694 |
| 2004/0207959 | A1 | 10/2004 | Saito | 360/324.1 |
| 2005/0201022 | A1 | 9/2005 | Horng et al. | 360/324.11 |
| 2005/0213258 | A1 | 9/2005 | Gill | 360/314 |
| 2005/0243474 | A1 * | 11/2005 | Gill | 360/324.1 |
| 2005/0264951 | A1 | 12/2005 | Gill | 360/324.11 |
| 2007/0019340 | A1 * | 1/2007 | Gill | 360/324.11 |
| 2007/0127167 | A1 * | 6/2007 | Freitag et al. | 360/324.11 |

OTHER PUBLICATIONS

Saito, Masamichi et al., "Narrow Track Current-Perpendicular-To-Plane Spin Valve GMR Heads" IEEE Transactions on Magnetics, vol. 40, No. 1, Jan. 2004.

* cited by examiner

Primary Examiner—David D Davis
(74) Attorney, Agent, or Firm—Zilka-Kotab, PC

(57) ABSTRACT

A current perpendicular to plane (CPP) magnetoresistive sensor that avoids spin torque noise while having high dr/R performance and small gap. The sensor is a dual magnetoresistive sensor having first and second pinned layers and a free layer disposed between the two pinned layers. One of the pinned layers is pinned by exchange coupling with an AFM layer, while the other pinned layer is self pinned by a shape enhanced magnetic anisotropy without the use of an AFM layer. The self pinned layer extends from the ABS to an extended stripe height distance that is greater than the stripe height distance of the AFM pinned layer and the free layer.

20 Claims, 4 Drawing Sheets

CURRENT PERPENDICULAR TO PLANE (CPP) MAGNETORESISTIVE SENSOR HAVING STRONG PINNING AND SMALL GAP THICKNESS

FIELD OF THE INVENTION

The present invention relates to magnetoresistive sensors and more particularly to a current perpendicular to plane (CPP) magnetoresistive that avoids spin torque noise and has a small gap.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The ever increasing demand for increased data rate and data capacity has lead a relentless push to develop magnetoresistive sensors having improved signal amplitude and reduced track width. Sensors that show promise in achieving higher signal amplitude are current perpendicular to plane (CPP) sensors. Such sensors conduct sense current from top to bottom, perpendicular to the planes of the sensor layers. Examples of CPP sensors include CPP GMR sensors. A CPP GMR sensor operates based on the spin dependent scattering of electrons through the sensor, similar to a more traditional CIP GMR sensor except that, as mentioned above, the sense current flows perpendicular to the plane of the layers.

However, a problem experienced by CPP GMR sensors is that they suffer from spin torque noise. As those skilled in the art will appreciate, spin torque noise occurs when electrons pass from one magnetic layer to another magnetic layer through a spacer. The polarization of the electrons and the magnetization of the free layer affect one another. The torque from polarized electrons can destabilize the magnetization of the free layer, causing spin torque noise. This will adversely affect the signal to noise ratio of a sensor, making the CPP GMR impractical.

One way to avoid spin torque noise is to construct a CPP GMR sensor as a dual sensor having a free layer disposed between two pinned layer structures. Unfortunately, such sensors have not been practical either, because the thickness of the gap (distance between the shields) becomes impractically large.

Therefore, there is a strong felt need for a CPP sensor design that can avoid spin torque noise. Such a sensor design would also necessarily maintain an acceptably small gap thickness.

SUMMARY OF THE INVENTION

The present invention provides a current perpendicular to plane magnetoresistive sensor that does not suffer from spin torque noise, has a high dr/R and has a small gap thickness. A sensor according to an embodiment of the invention includes first and second pinned layers and a free layer located between the first and second pinned layers. The first pinned layer is extended in a stripe height direction the second pinned layer and the free layer extend to a shorter stripe height.

The second pinned layer is pinned by exchange coupling with a layer of antiferromagnetic material (AFM layer), while the first pinned layer is self pinned in that it does not require an AFM layer for pinning. This advantageously decreases gap height by eliminating the need for another thick second AFM layer to pin the first pinned layer. The first pinned layer is pinned by a shape induced magnetic anisotropy provided as a result of its stripe height extended shape.

Because the sensor is a dual CPP sensor it does not suffer from spin torque noise. The combined effects of the first and second pinned layers advantageously cancel out, eliminating the spin torque noise effect suffered by single CPP GMR sensors.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
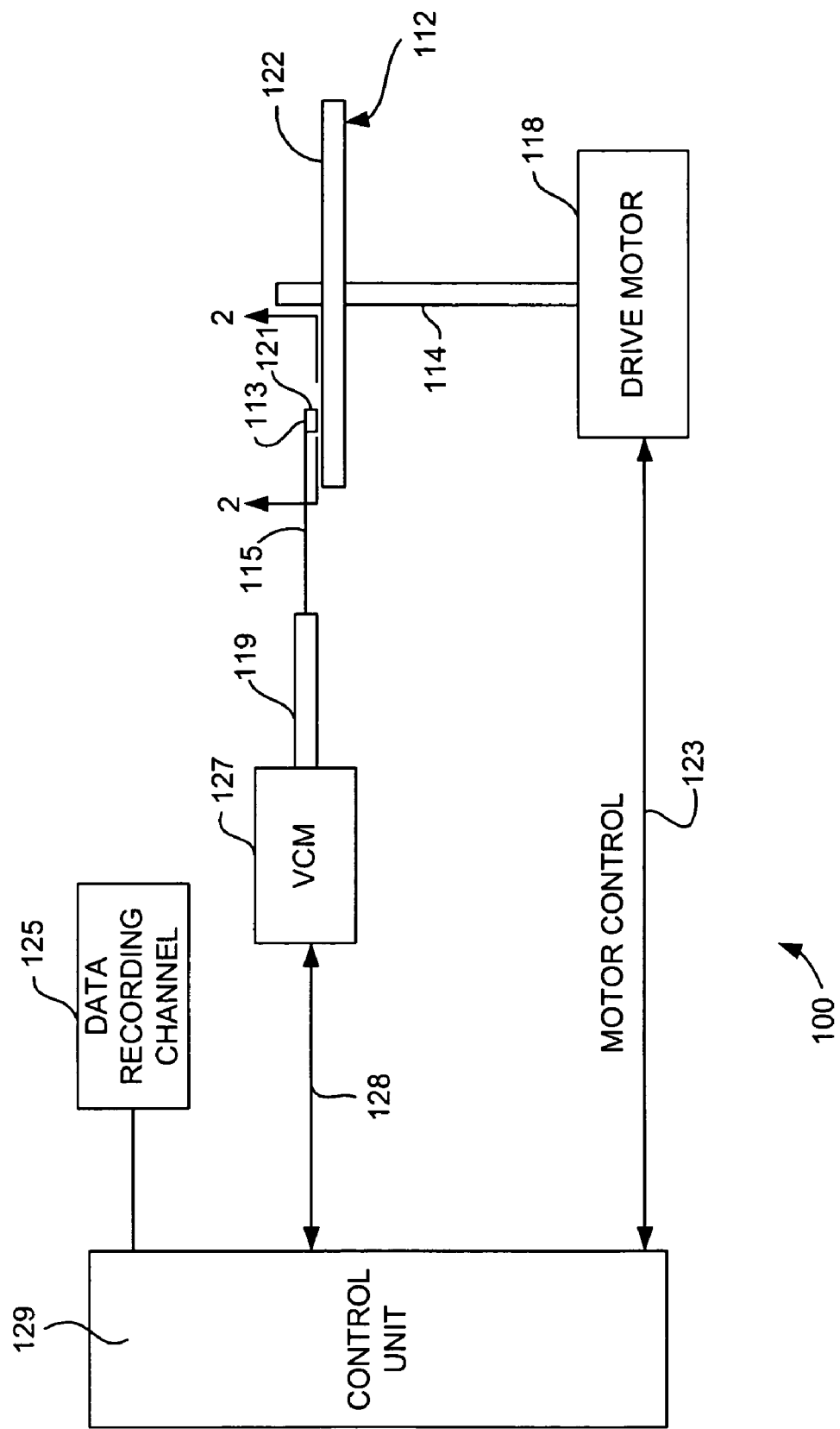
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. I may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
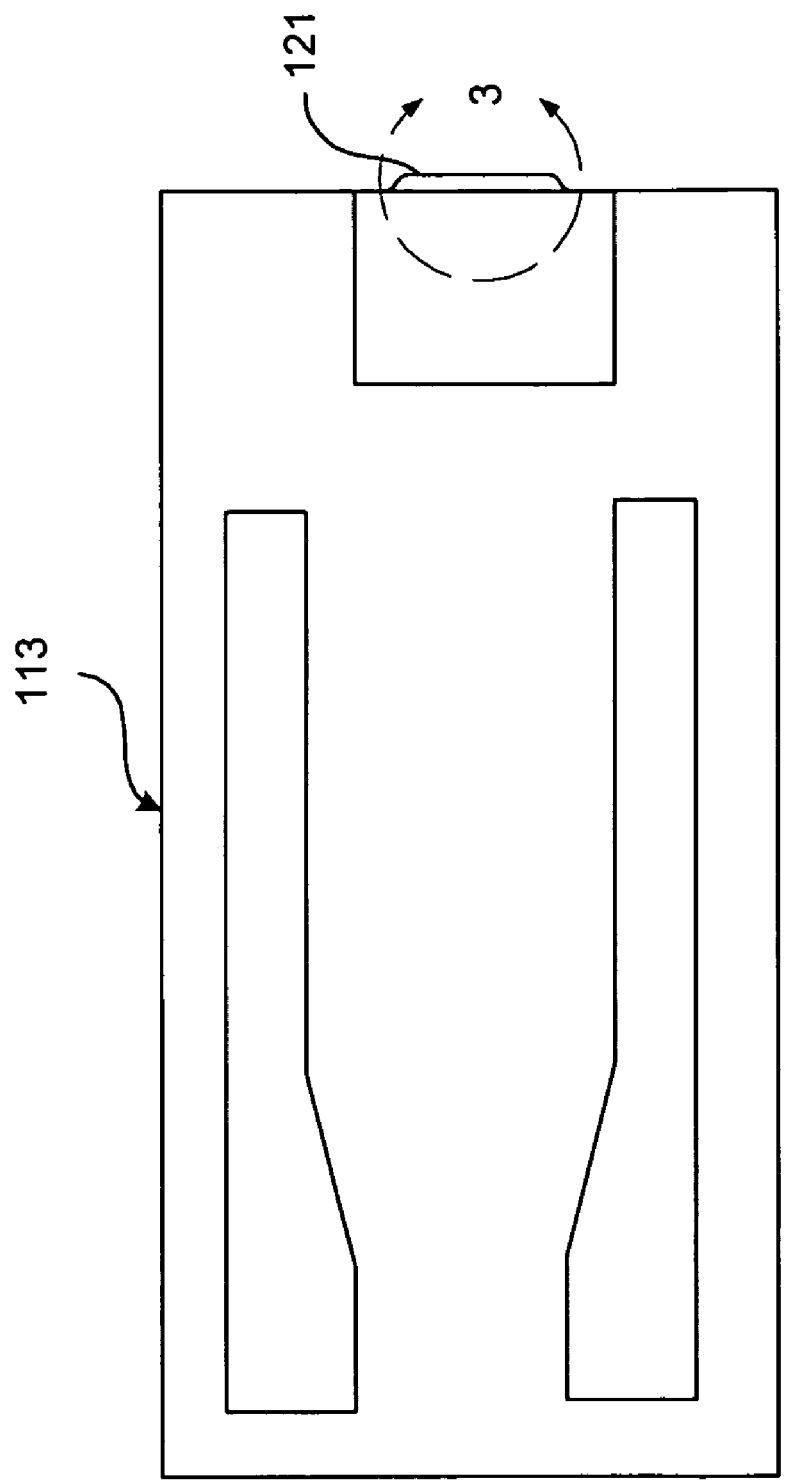
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
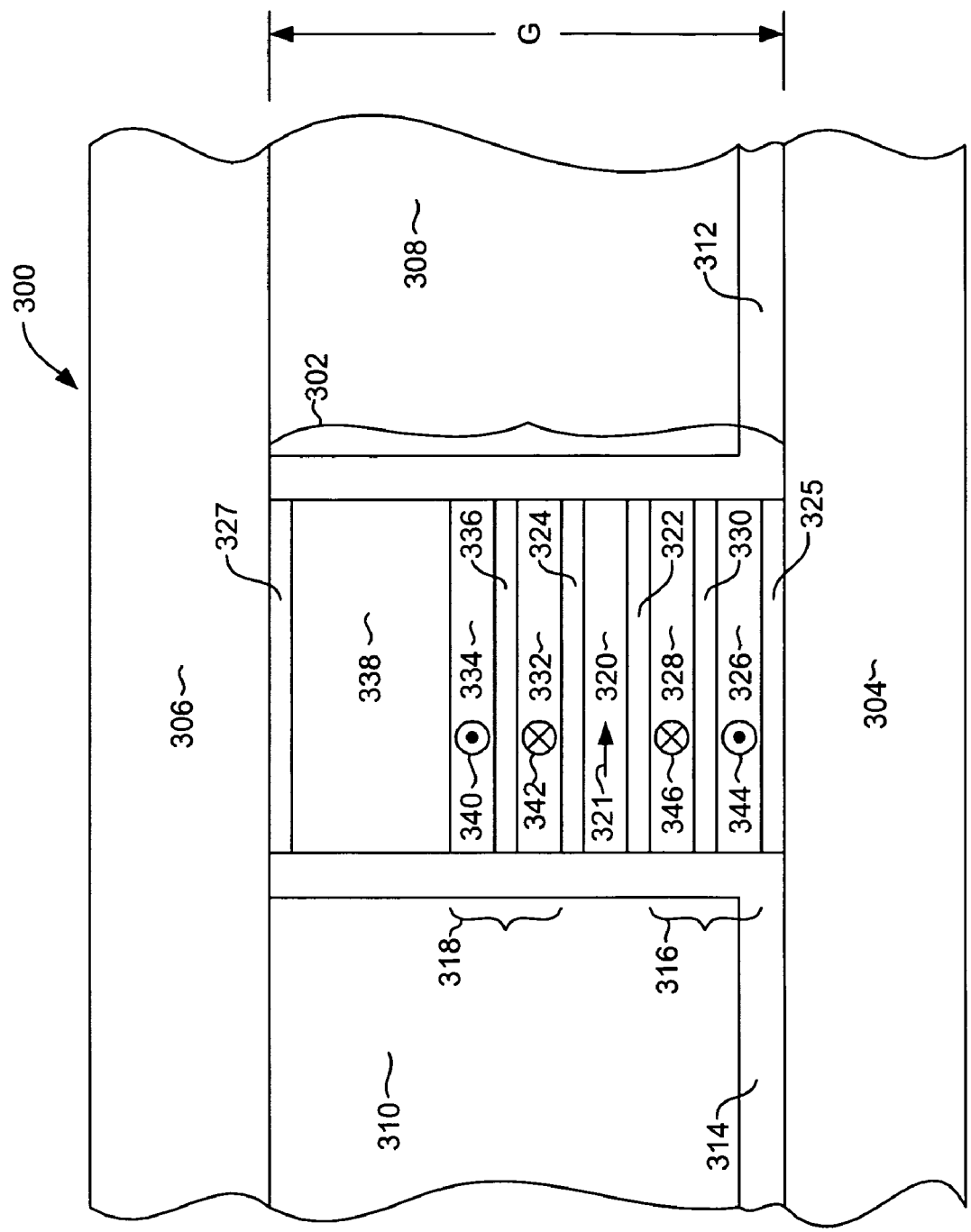
FIG. 3 is an enlarged ABS view taken from circle 3 of FIG. 2 rotated 90 degrees counterclockwise.

With reference now to FIG. 3, a current perpendicular to plane giant magnetoresistive (CPP GMR) sensor 300 according to an embodiment of the invention includes a sensor stack 302 that is sandwiched between first and second electrically conductive leads 304, 306, which supply a sense current to the sensor during operation. The leads 304, 306 can be constructed of a magnetic material such as NiFe so that they can function as magnetic shield layers as well as electrical leads. First and second hard bias layers 308, 310 extend laterally from the sides of the sensor stack 302. The hard bias layers 308, 310 are constructed of a hard magnetic material such as CoPtCr, etc. and provide a bias field for biasing the magnetization of the free layer, as will be described in greater detail below. First and second side insulation layers 312, 314 are formed at either lateral side of the sensor stack and across the surface of the first lead 304 to prevent sense current from being shunted through the hard bias layers 308, 310.

With continued reference to FIG. 3, the sensor stack 302 includes first and second pinned layer structures 316, 318. A magnetic free layer 320 is disposed between the first and second pinned layer structures 316, 318. A first non-magnetic, electrically conductive spacer layer 322 is sandwiched between the first pinned layer structure 316 and the free layer 320, and a second non-magnetic, electrically conductive spacer layer 324 is sandwiched between the spacer layer 320 and the second pinned layer 324. A seed layer 325 such as NiFeCr or NiFe may be provided at the bottom of the sensor stack 302, and a capping layer 327 such as Ta may be provided at the top of the sensor stack 302 to protect the sensor layers during manufacture.

The free layer 320 is constructed of a low coercivity magnetic material such as one or more layers of Co, CoFe or NiFe. The first and second spacer layers 322, 324 can be constructed of Cu. The free layer 320 has a magnetization 321 that is biased in a desired direction parallel with the ABS but that is free to rotate in the response to a magnetic field. Biasing for the free layer 320 is provided by a bias field from the hard bias layers 308, 310. The first pinned layer structure 316 includes first and second magnetic layers AP1 326 and AP2 328, which are antiparallel coupled across a non-magnetic coupling layer 330 such as Ru. The AP1 and AP2 layers can be constructed of, for example CoFe or other suitable magnetic materials. Similarly, the second pinned layer structure 318 includes third and fourth magnetic layers AP3 332, AP4 336, which are antiparallel coupled across a non-magnetic coupling layer 336 such as Ru. The AP3 and AP4 layers 332, 336 can also be constructed of CoFe, or other suitable magnetic materials.

The AP4 layer 334 of the second pinned layer structure 318 is exchange coupled with a layer of antiferromagnetic material AFM layer 338 such as PtMn, IrMn, etc. An exchange field from the AFM layer 338 strongly pins the magnetization 340 of the AP4 layer 334 in a desired direction perpendicular to the ABS as shown. Antiparallel coupling between the AP4 and AP3 layers 332, 334 pins the magnetization 342 of the AP 3 layer 332 in a desired direction perpendicular to the ABS and antiparallel to the direction of the magnetization 340 of the AP4 layer 334. In order for the AFM layer 338 to function effectively in pinning the magnetization 340 of the AP4 layer 334, the AFM layer must be thick. For example, the AFM layer must have a thickness of 50-150 Angstroms, where the desired total gap budget is 300 to 400 Angstroms.

With reference still to FIG. 3, the first pinned layer 316, has an AP1 326 layer with a magnetization 344 that is pinned in a direction perpendicular to the ABS, the AP2 layer 328 has a magnetization 346 that is pinned in a direction that is perpendicular to the ABS and antiparallel with the magnetization 344 of the AP1 layer 326. The magnetization 346 of the AP2 layer 328 should be oriented in the same direction as the magnetization 342 of the AP3 layer 332 in order for the sensor 300 to function properly.

It can be seen that the there is no AFM layer to pin the magnetization of the first pinned layer structure 316. The first pinned layer 316 is self pinned so that it needs no AFM layer for pinning. Eliminating this AFM layer allows the gap G to be much thinner than would be the case if a second AFM were needed. The first pinned layer structure is pinned by a shape enhanced anisotropy, with assistance from other factors, which will be explained below.

Figure 4:
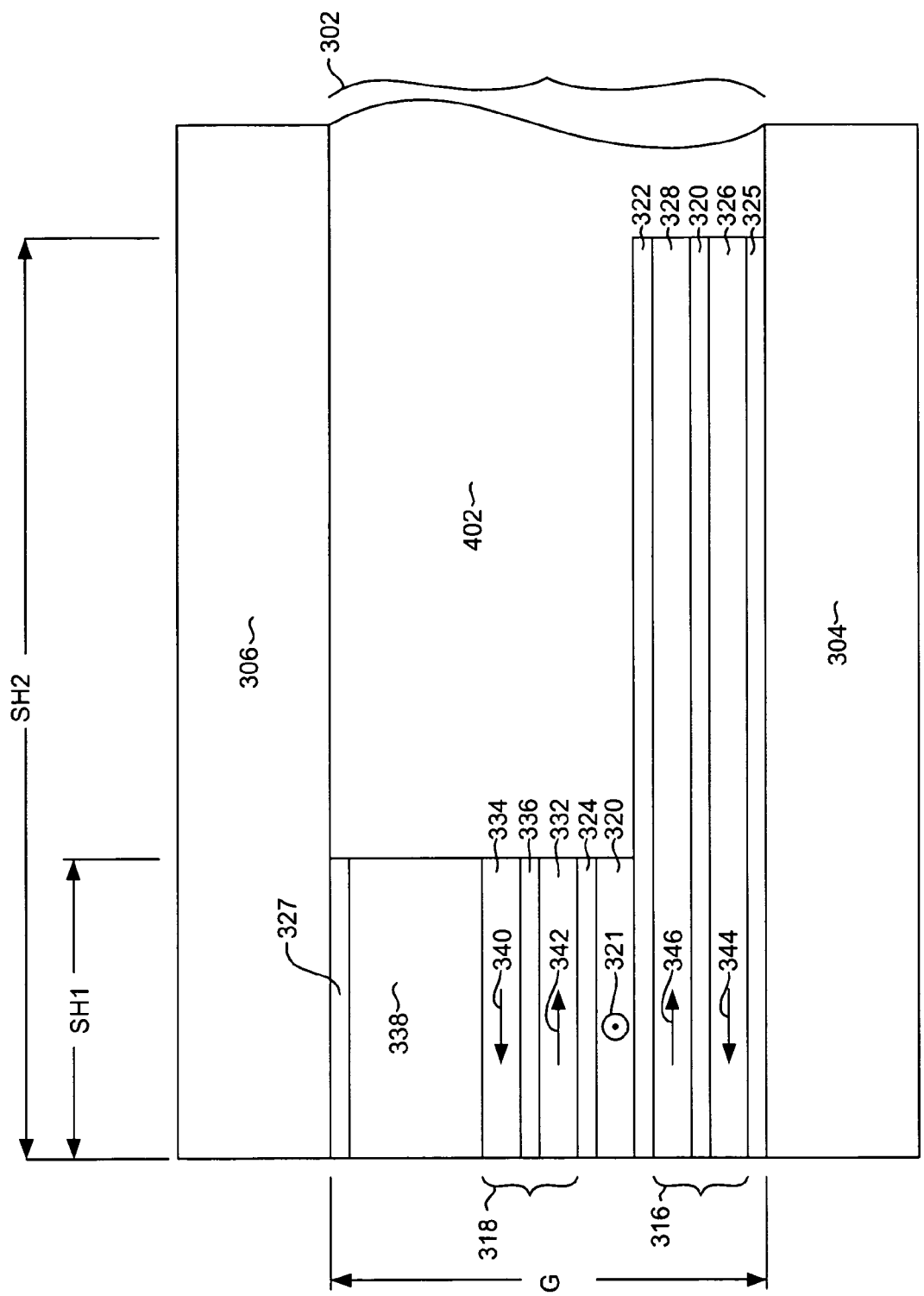
FIG. 4 is a cross sectional view taken from line 4-4 of FIG. 3.

With reference to FIG. 4, it can be seen that first pinned layer 316 extends to a first stripe height SH1 as measured from the ABS. All or a portion of the first spacer layer 322 may extend to this first stripe height distance as well. It can also be seen that the second pinned layer structure 318 (that at the top) as well as the AFM layer 338, the second spacer layer 324 and the free layer 321 extend to a second stripe height distance SH2 that is much shorter than SH1. This second stripe height distance defines the effective stripe height of the sensor. An electrically insulating fill material 402 such as alumina fills the area behind the sensor stack 302.

Extending the pinned layer 316 in the stripe height direction to the first stripe height distance SH1 creates a strong shape enhanced magnetic anisotropy in the AP1 and AP2 layers 326, 328 in a desired direction perpendicular to the ABS. This shape enhanced anisotropy pins the magnetizations of the 344, 346 of the AP1 and AP2 layers 326, 328 without the need for an AFM layer. In order to provide effective shape enhanced pinning, the first stripe height distance SH1 is preferably 3-10 times or about 5 the second stripe height distance SH2. However, the first stripe height distance SH1 is at least larger than the second stripe height distance SH2.

Pinning can be further assisted by constructing the AP1 and AP2 layers 326, 328 of a material having a strong positive magnetostriction. Such a material could be, for example CoFe. A positive magnetostriction along with compressive stresses that are inherently present in such magnetoresistive sensors, creates further magnetic anisotropy in a direction perpendicular to the ABS. Pinning is assisted still further by the antiparallel coupling between the AP1 and AP2 layers 326, 328.

Making the sensor 300 as a dual GMR sensor having a free layer 320 and two pinned layer structures 316, 318 eliminates the spin torque problem discussed in the Background of the Invention. This is because the effects from the two pinned layer structures 316, 318 cancel one another out. As an important added benefit, the dual spin valve design provides greatly increased GMR effect (dr/R). Eliminating the need for a second AFM layer greatly reduces the gap thickness G, making the sensor 300 practical at current and future gap thickness requirements. For example, eliminating the need for a second AFM layer reduces the gap G by a 5-15 nm as compared with a sensor having an AFM for pinning both pinned layers 316, 318.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A current perpendicular to plane (CPP) magnetoresistive sensor having an air bearing surface, the sensor comprising:
    a first magnetic pinned layer structure, the entire first pinned layer structure extending from the air bearing surface to a first stripe height distance as measured from the air bearing surface and terminating at the first stripe height distance;
    a second magnetic pinned layer structure, the entire second pinned layer structure extending from the air bearing surface to a second stripe height distance that is greater than the first stripe height distance as measured from the air bearing surface and terminating at the second stripe height distance;
    a magnetic free layer structure, located between the first and second pinned layer structures;
    a first non-magnetic electrically conductive spacer layer sandwiched between the first pinned layer structure and the free layer; and
    a second non-magnetic electrically conductive spacer layer sandwiched between the second pinned layer structure and the free layer.

2. A sensor as in claim 1, wherein the first pinned layer structure includes a first magnetic layer (AP1), a second magnetic layer (AP2) and a non-magnetic coupling layer sandwiched between the AP1 and AP2 layers.

3. A sensor as in claim 1, wherein the first pinned layer structure includes a first magnetic layer (AP1), a second magnetic layer (AP2) layer and a non-magnetic coupling layer sandwiched between the AP1 and AP2 layers, the AP1 and AP2 layers comprising a material having a positive magnetostriction.

4. A sensor as in claim 1, wherein the first pinned layer structure includes a first magnetic layer (AP1), a second magnetic layer (AP2) layer and a non-magnetic coupling layer sandwiched between the AP1 and AP2 layers, the AP1 and AP2 layers comprising CoFe.

5. A sensor as in claim 1, wherein:
the first pinned layer structure includes a first magnetic layer (AP1), a second magnetic layer (AP2) and a first non-magnetic coupling layer sandwiched between the AP1 and AP2 layers; and
the second pinned layer structure includes a third magnetic layer (AP3) a fourth magnetic layer (AP4) and a second non-magnetic coupling layer sandwiched between the AP3 and AP4 layers.

6. A sensor as in claim 1, wherein the first stripe height distance is 3-10 times the second stripe height distance.

7. A sensor as in claim 1, wherein the first stripe height distance is about five times the second stripe height distance.

8. A sensor as in claim 1, wherein:
the first pinned layer structure includes a first magnetic layer (AP1), a second magnetic layer (AP2) and a first non-magnetic coupling layer sandwiched between the AP1 and AP2 layers; and
the second pinned layer structure includes a third magnetic layer (AP3) a fourth magnetic layer (AP4) and a second non-magnetic coupling layer sandwiched between the AP3 and AP4 layers; wherein
the AP1, AP2, AP3 and AP4 layers comprise a material having a positive magnetostriction, and the first and second coupling layers comprise Ru.

9. A sensor as in claim 1, wherein:
the first pinned layer structure includes a first magnetic layer (AP1), a second magnetic layer (AP2) and a first non-magnetic coupling layer sandwiched between the AP1 and AP2 layers; and
the second pinned layer structure includes a third magnetic layer (AP3) a fourth magnetic layer (A P4) and a second non-magnetic coupling layer sandwiched between the AP3 and AP4 layers; wherein
the AP1, AP2, AP3 and AP4 layers comprise CoFe, and the first and second coupling layers comprise Ru.

10. A sensor as in claim 1, wherein at least a portion of the first spacer layer extends to the first stripe height distance.

11. A sensor as in claim 1, wherein the free layer extends from the ABS to the second stripe height distance, terminating at the second stripe height distance.

12. A sensor as in claim 1, wherein the free layer and the second non-magnetic electrically conductive spacer layer terminate at the second stripe height distance.

13. A magnetoresistive sensor as in claim 1, further comprising a first electrically conductive lead disposed adjacent to the first pinned layer structure and a second electrically conductive lead disposed adjacent to the second AFM layer structure.

14. A current perpendicular to plane (CPP) magnetoresistive sensor having an air bearing surface, the sensor comprising:

a first magnetic pinned layer structure;
a second magnetic pinned layer structure;
a magnetic free layer located between the first and second pinned layer structures;
a first non-magnetic, electrically conductive spacer layer sandwiched between the first pinned layer structure and the free layer;
a second non-magnetic, electrically conductive spacer layer sandwiched between the second pinned layer structure and the free layer; and
a layer of antiferromagnetic material exchange coupled with the second pinned layer; wherein
the entire first pinned layer structure and the free layer extend from the air bearing surface to a first stripe height distance as measured from the air bearing surface, and terminate at the first stripe height distance;
the entire second pinned layer structure extends from the air bearing surface to a second stripe height distance measured from the air bearing surface and terminates at the second stripe height distance, the second stripe height distance being larger than the first stripe height distance;
the second pinned layer structure has a magnetization that is pinned by the exchange coupling with the layer of antiferromagnetic material; and
the first pinned layer structure is self pinned without the assistance of exchange coupling from a layer of antiferromagnetic material.

15. A magnetoresistive sensor as in claim 14 wherein the second stripe height distance is 3-10 times the first stripe height distance.

16. A magnetoresistive sensor as in claim 14 wherein the second stripe height distance is about 5 times the first stripe height distance.

17. A magnetoresistive sensor as in claim 14 wherein the first pinned layer comprises a first magnetic layer AP1, a second magnetic layer AP2 and a non-magnetic coupling layer sandwiched between the AP1 and AP2 layers, the AP1 and AP2 layers being constructed of a magnetic material having a positive magnetostriction.

18. A magnetoresistive sensor as in claim 14 wherein the first pinned layer comprises a first magnetic layer AP1, a second magnetic layer AP2 and a non-magnetic coupling layer sandwiched between the AP1 and AP2 layers, the AP1 and AP2 layers comprising CoFe.

19. A magnetoresistive sensor as in claim 14 wherein:
the first pinned layer comprises a first magnetic layer AP1, a second magnetic layer AP2 and a non-magnetic coupling layer sandwiched between the AP1 and AP2 layers, the AP1 and AP2 layers comprising CoFe; wherein the AP1; and
AP2 layers have magnetizations that are pinned by a combination of shape induced magnetic anisotropy, magnetostriction induced magnetic anisotropy and antiparallel coupling between the AP1 and AP2 layers.

20. A magnetoresistive sensor as in claim 14 further comprising a first electrically conductive lead disposed adjacent to the first pinned layer structure and a second electrically conductive lead disposed adjacent to the second pinned layer structure.

* * * * *

UNITED STATES PATENT AND TRADEMARK OFFICE
CERTIFICATE OF CORRECTION

PATENT NO. : 7,652,856 B2 Page 1 of 1
APPLICATION NO. : 11/320547
DATED : January 26, 2010
INVENTOR(S) : Pinarbasi It is certified that error appears in the above-identified patent and that said Letters Patent is hereby corrected as shown below:

In claim 9, column 7, line 41, please replace "(A P4)" with --(AP4)--.

Signed and Sealed this

Eighth Day of June, 2010

David J. Kappos
*Director of the United States Patent and Trademark Office*